US010598719B2

(12) United States Patent
Cohen et al.

(10) Patent No.: US 10,598,719 B2
(45) Date of Patent: Mar. 24, 2020

(54) METHOD OF CHARACTERIZING A SECTION OF A TRANSMISSION LINE, IN PARTICULAR SECTION CORRESPONDING TO A CONNECTOR OR SERIES OF CONNECTORS LINKING A MEASUREMENT APPARATUS TO A CABLE

(71) Applicant: COMMISSARIAT A L'ENERGIE ATOMIQUE ET AUX ENERGIES ALTERNATIVES, Paris (FR)

(72) Inventors: Josy Cohen, Le Plessis-Trévise (FR); Nicolas Gregis, Fresnes (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 175 days.

(21) Appl. No.: 15/560,477

(22) PCT Filed: Mar. 25, 2016

(86) PCT No.: PCT/EP2016/056692
§ 371 (c)(1),
(2) Date: Sep. 21, 2017

(87) PCT Pub. No.: WO2016/156259
PCT Pub. Date: Oct. 6, 2016

(65) Prior Publication Data
US 2018/0059164 A1    Mar. 1, 2018

(30) Foreign Application Priority Data
Mar. 27, 2015  (FR) ...................... 15 52628

(51) Int. Cl.
*G01R 31/11*   (2006.01)
(52) U.S. Cl.
CPC ................... *G01R 31/11* (2013.01)

(58) Field of Classification Search
CPC ..................... G01R 31/11; G01N 21/3586
See application file for complete search history.

(56) References Cited

U.S. PATENT DOCUMENTS

| 7,282,922 B2 * | 10/2007 | Lo ..................... G01R 31/11 324/533 |
|---|---|---|
| 2006/0012376 A1 | 1/2006 | Furse et al. |
| 2006/0182269 A1 * | 8/2006 | Lo ..................... G01R 31/11 379/406.08 |

FOREIGN PATENT DOCUMENTS

| EP | 0 623 827 A2 | 11/1994 |
|---|---|---|
| EP | 1 477 820 A2 | 11/2004 |
| FR | 3 025 320 A1 | 3/2016 |

OTHER PUBLICATIONS

Ki Seok Kwak et al., "Reduction of the blind spot in the time-frequency domain reflectometry," IEICE Electronics Express, vol. 5, No. 8, 2008, pp. 265-270.

(Continued)

*Primary Examiner* — Bryan Bui
(74) *Attorney, Agent, or Firm* — Baker & Hostetler LLP (57) ABSTRACT

A method for characterizing a segment of a transmission line, a reference signal being injected into the line and a time-domain measurement of the reflection of the reference signal in the line being carried out, the method comprises the following steps: applying a deconvoluting step to the time-domain measurement so as to generate a deconvoluted temporal sequence comprising a plurality of amplitude peaks each corresponding to an impedance discontinuity; removing, from the amplitude of at least one obtained peak, the contribution of at least one secondary reflection of the signal from an impedance discontinuity; deducing, from the temporal position of each peak, a position of an associated impedance discontinuity in the line segment; and deducing, from the amplitude of each peak, an estimate of the real part (Continued)

of the reflection coefficient of a wave reflected from each identified impedance discontinuity.

17 Claims, 5 Drawing Sheets

(56) References Cited

OTHER PUBLICATIONS

Qinghai Shi et al., "System simulation of network analysis for a lossy cable system," 9th International Multi-Conference on Systems, Signals and Devices, 2012.

* cited by examiner

METHOD OF CHARACTERIZING A SECTION OF A TRANSMISSION LINE, IN PARTICULAR SECTION CORRESPONDING TO A CONNECTOR OR SERIES OF CONNECTORS LINKING A MEASUREMENT APPARATUS TO A CABLE

CROSS-REFERENCE TO RELATED APPLICATIONS

This application is a National Stage of International patent application PCT/EP2016/056692, filed on Mar. 25, 2016, which claims priority to foreign French patent application No. FR 1552628, filed on Mar. 27, 2015, the disclosures of which are incorporated by reference in their entirety.

FIELD OF THE INVENTION

The present invention relates to the field of systems and methods for diagnosing cables and in particular to the field of methods allowing faults affecting a cable to be detected and/or located.

The invention more precisely relates to a method allowing a segment of a transmission line to be characterized by modeling with a model taking the form of a succession of segments of individual lengths and characteristic impedances.

In particular, the invention is advantageously used to characterize a connection or a connector or even a succession of connectors connecting a piece of measuring equipment to a cable. The piece of measuring equipment is configured to perform a reflectometry measurement by injecting a reference signal into the cable and by measuring the reflection of this signal from the impedance discontinuities encountered on its path.

The invention is applicable to any field in which it is necessary to characterize mechanical and/or electrical connections between a cable and a measuring apparatus.

The invention is applicable to any type of electrical cable, in particular power-transmission cables or communication cables, in fixed or mobile installations. The cables in question may be coaxial cables, twin-lead cables, parallel-line cables, twisted-pair cables, the cables of a cable assembly, or any other type of cable. The invention is also applicable to mechanical cables, for example cables used to hold up pieces of infrastructure such as lifts or bridges.

SUMMARY

According to a known principle, what are called reflectometry methods may be used to detect and/or locate mechanical or electrical faults that cause discontinuities or changes in the impedance in a cable.

These methods use a principle similar to that of radar: an electrical signal, often high-frequency or wideband, is injected at one or more locations into the cable to be tested. The signal propagates through the cable or the network and some of its energy is reflected when it encounters an electrical discontinuity. An electrical discontinuity may result, for example, from a connection, from the end of the cable or more generally from any change in the propagation conditions of the signal in the cable. Such a discontinuity most often results from a fault that locally modifies the characteristic impedance of the cable, thereby creating a discontinuity in its parameters per unit length.

Analysis, at the point of injection, of the reflected signals allows information on the presence and location of these discontinuities, and therefore of possible faults, to be deduced. Analysis is conventionally carried out in the time or frequency domain. These methods are referred to as TDR (for time-domain reflectometry) and FDR (for frequency-domain reflectometry) methods.

The measuring apparatus used to inject the signal into the cable and to measure the reflected signal may take various forms, it may be a question of a network analyzer or an embedded device on a circuit board. The variety of possible measuring apparatuses and the diversity of the types of cable to which reflectometry fault characterization may be applied makes it necessary to make provision for many types of connections or connectors allowing these various possible pieces of measuring equipment to be connected to the various types of cable.

Specifically, a connector is required to electrically and mechanically connect the cable under test and the measuring apparatus.

This connector itself has a characteristic impedance that is specific thereto, but this piece of information is not always accessible. For certain types of cable, for example twisted-pair cables, standard connectors do not exist, in particular for the network analyzers available at the current time. Sometimes, it is necessary to associate a number of types of connectors in series to achieve a satisfactory connection.

Connection of a connector between a measuring apparatus and a cable creates an impedance discontinuity because of the different values of the characteristic impedances of the various elements.

The signal injected by the measuring apparatus therefore reflects, even before it enters into the cable, from the impedance discontinuity caused by the connector. This effect leads to the presence of blind spots in the time-domain reflectogram obtained from measurement of the reflected signal. One blind spot is in particular located level with the connector. If a low-amplitude fault is present in this spot, its signature on the reflectogram will be masked by the echo of the signal from the impedance discontinuity associated with the connector.

Thus, there is a need to precisely characterize the one or more connectors which may be used in the context described above, in particular by estimating their equivalent characteristic impedance. On the basis of this characterization, it is then possible to remove, from a reflectogram, the known contributions of the connectors in order to better identify the presence of faults, in particular soft faults, located in the blind spots.

Prior-art methods that address the problem of blind spots in reflectometry in general concentrate on separating the incident signal injected into the cable and the signals reflected from faults in the cable. Blind-spot reduction is spoken of. The objective of these methods is not to characterize the nature of the reflections but simply, at constant frequency, to decrease the width of the trace of each contribution in the measurement to limit interactions. Mention may be made, in this respect, of European patent application EP0623827 or even of the article "Reduction of the blind spot in the time-frequency domain reflectometry" Kwak et al. IEICE Electronics Express 2008.

The present invention aims to characterize one or more connectors connecting a piece of measuring equipment to a cable by modeling the section of transmission line corresponding to the connector(s) with a model taking the form of a succession of segments each of constant characteristic impedance, said segments being separated by interfaces corresponding to impedance discontinuities from which the signal is reflected.

The invention allows any connector or more generally any section of a transmission line to be characterized. The characteristic impedance values obtained with the method, and the positions of the impedance discontinuities, are saved in a database, which not only allows a large number of connections to be characterized, but also allows any changes in this characterization as a function of time or as a function of physical parameters such as temperature or humidity to be tracked.

SUMMARY OF THE INVENTION

One subject of the invention is a method for characterizing a segment of a transmission line, a reference signal being injected into the line and a time-domain measurement of the reflection of said reference signal in the line being carried out, said method comprising the following steps:

applying a deconvoluting step to said time-domain measurement so as to generate a deconvoluted temporal sequence comprising a plurality of amplitude peaks each corresponding to an impedance discontinuity;

removing, from the amplitude of at least one obtained peak, the contribution of at least one secondary reflection of the signal from an impedance discontinuity by executing at least the following steps:
  identifying the peaks located at a temporal position potentially corresponding to a secondary reflection;
  calculating the amplitude contribution of the secondary reflection;
  subtracting from the amplitude of the identified peak the calculated contribution; and
  if the obtained amplitude is substantially zero, removing the peak;

deducing, from the temporal position of each peak, a position of an associated impedance discontinuity in said line segment; and deducing, from the amplitude of each peak, an estimate of the real part of the reflection coefficient of a wave reflected from each identified impedance discontinuity.

According to one particular aspect of the invention, said segment corresponds to a connector or a series of connectors connecting a piece of measuring equipment to a cable, the time-domain reflection measurement being taken in a temporal zone corresponding to the zone of presence of the connector or of the series of connectors.

According to one particular aspect of the invention, the deconvoluting step furthermore comprises a linear interpolation and may be executed using a CLEAN algorithm.

According to one particular aspect of the invention, the step of removing the contribution of at least one secondary reflection comprises the following substeps:

Selecting a first peak and a second peak and measuring their temporal spacing d;

Seeking at least one third peak distant from the first peak by a temporal spacing nd that is a multiple of the temporal spacing d between the first peak and the second peak;

Determining, from the amplitudes of the first and second peaks, an estimate of the real parts of the reflection coefficients associated with the impedance discontinuities corresponding to the first and second peaks, respectively;

Determining an estimate of the amplitude of the nth reflection of the signal from the impedance discontinuity corresponding to the second peak, n varying over the values corresponding to the multiples nd of the temporal spacing d at which a third peak was found;

Subtracting from the amplitude of said at least one third peak, the estimate of the amplitude of the determined nth reflection of the signal, n corresponding to the multiple of the temporal spacing d between the first peak and the second peak at which said at least one third peak is located; and If the obtained amplitude is substantially zero, removing said at least one third peak.

According to one particular aspect of the invention, the step of removing the contribution of at least one secondary reflection comprises the following substeps:

Selecting a first peak and a second peak and measuring their temporal spacing d;

Determining, from the amplitudes of the first and second peaks, an estimate of the real parts of the reflection coefficients associated with the impedance discontinuities corresponding to the first peak and the second peak, respectively;

Determining an estimate of the amplitude of the $n^{th}$ reflection of the signal from the impedance discontinuity corresponding to the second peak, n being a nonzero positive integer; and Subtracting the estimate of the amplitude of the $n^{th}$ reflection of the signal from the amplitude of a sample of the deconvoluted sequence, the sample being located at a distance nd that is a multiple of the temporal spacing d between the first peak and the second peak.

According to one particular aspect of the invention, said substeps are iterated and, in the first iteration, the first selected peak is the first peak in the temporal order of appearance, the second selected peak being the second peak in the temporal order of appearance;

and in the following iterations, the second selected peak is the peak successive to the two peaks selected in the preceding iteration and the first selected peak is one of the peaks selected in one of the preceding iterations.

According to one particular aspect of the invention, the estimate of the real part of the reflection coefficient associated with each impedance discontinuity is determined using the following relationship:

$$\rho_1 = A_1$$

$$\rho_i = \frac{A_i}{\prod_{j=1}^{i-1}(1-(\rho_j)^2)} \text{ for } i \text{ varying from 2 to } N;$$

where $A_i$ is the amplitude of a peak indexed temporally by the integer i, $\rho_i$ is the real part of the reflection coefficient of a wave reflected from the impedance discontinuity associated with said peak, and $\rho_j$ are the real parts of the reflection coefficients of a wave reflected from the impedance discontinuities associated with the peaks preceding said peak.

In one particular variant, the method according to the invention furthermore comprises a step of determining an estimate of the real part of the characteristic impedance associated with each segment of transmission line bounded by two successive impedance discontinuities, from estimates corresponding to the real parts of the reflection coefficients associated with said two impedance discontinuities.

In one particular variant, the method according to the invention furthermore comprises a step of determining an estimate of the imaginary part of the characteristic impedance associated with each impedance discontinuity, from the real part of said characteristic impedance.

In one particular variant, the method according to the invention furthermore comprises the following steps:
Reconstructing, from the determined values of the real and imaginary parts of the characteristic impedances, an estimate of the reflected signal; and
Determining information characterizing the degree of similarity between the reconstructed estimate of the signal and the time-domain measurement of the reflection of the signal.

In one particular variant, the method according to the invention furthermore comprises the following steps:
Convoluting the temporal sequence made up of the amplitude peaks compensated for the contribution of at least one secondary reflection, with the reference signal; and
Determining information characterizing the degree of similarity between the convoluted sequence and the time-domain measurement of the reflection of the signal.

According to one particular aspect of the invention, the information characterizing similarity is taken to be the coefficient of determination $R^2$ or the likelihood ratio $V^2$.

According to one particular aspect of the invention, said method is iterated while modifying in each iteration the number of amplitude peaks extracted in the deconvoluting step, and the retained solution is that with the highest degree of similarity.

In one variant embodiment, the method according to the invention furthermore comprises a step of feeding a database with the positions and reflection coefficients and/or characteristic impedances of the calculated impedance discontinuities, each entry of the database being associated with a connector or a set of series-connected connectors intended to interconnect a measuring apparatus and a cable.

Another subject of the invention is a database comprising a plurality of pairs of values of positions and reflection coefficients and/or characteristic impedances of impedance discontinuities, said plurality of pairs being determined by executing the method for characterizing a segment of a transmission line according to the invention, each pair of values in the database being indexed to an entry associated with a connector or a set of series-connected connectors intended to interconnect a measuring apparatus and a cable.

Other subjects of the invention are a computer program containing instructions for executing the method for characterizing a segment of a transmission line according to the invention, when the program is executed by a processor, and a processor-readable storage medium on which is stored a program containing instructions for executing the method for characterizing a segment of a transmission line according to the invention, when the program is executed by a processor.

BRIEF DESCRIPTION OF THE DRAWINGS

Other features and advantages of the present invention will become more clearly apparent on reading the following description with reference to the appended drawings, which show.

DETAILED DESCRIPTION

Figure 1A:
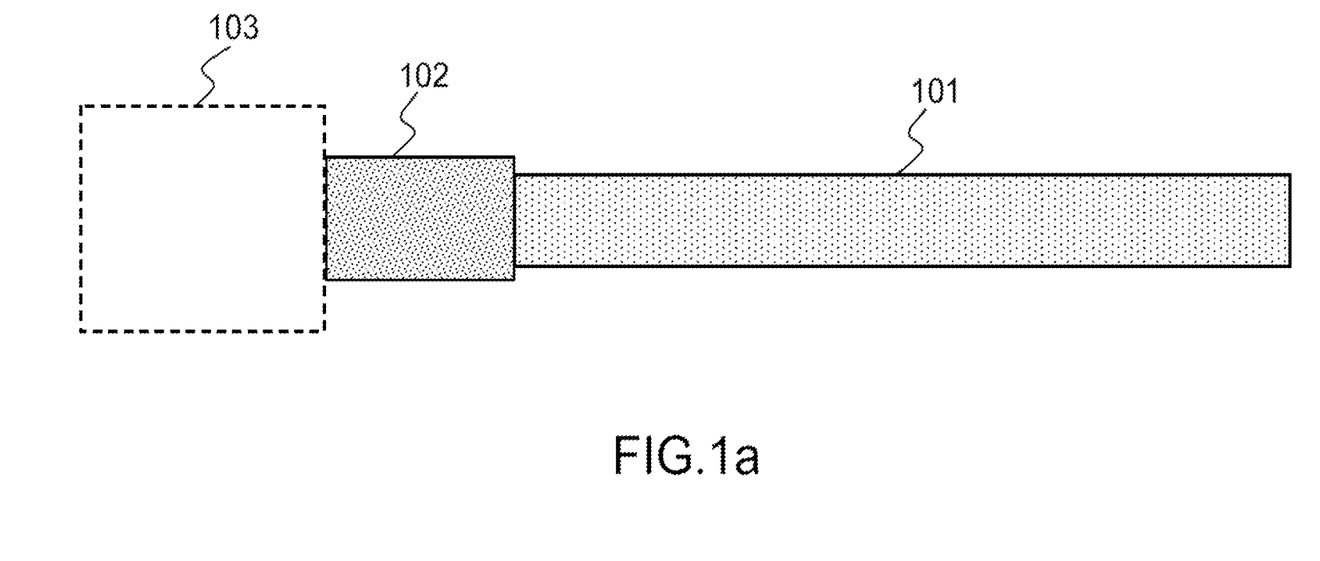
FIGS. 1a and 1b, a schematic diagram of a transmission line and an associated time-domain reflectogram.

FIG. 1a shows, in a simplified schematic, a cable 101 to be analyzed connected to a measuring apparatus 103 able to generate a signal in order to inject it into the cable 101 and to measure the reflection of the signal from the impedance discontinuities of the cable. Alternatively, the measuring apparatus 103 may be disassociated into two separate apparatuses, a first apparatus for generating and injecting the test signal and a second apparatus for measuring the reflected signal. The measuring apparatus 103 is connected to the cable 101 via a connection or connector 102. The connection 102 may consist of a plurality of series-connected connectors. The connection 102 may be composed of solder joints, chocolate blocks, coaxial connecting cables or any other connecting means allowing a piece of measuring equipment to be connected to a cable.

Figure 1B:
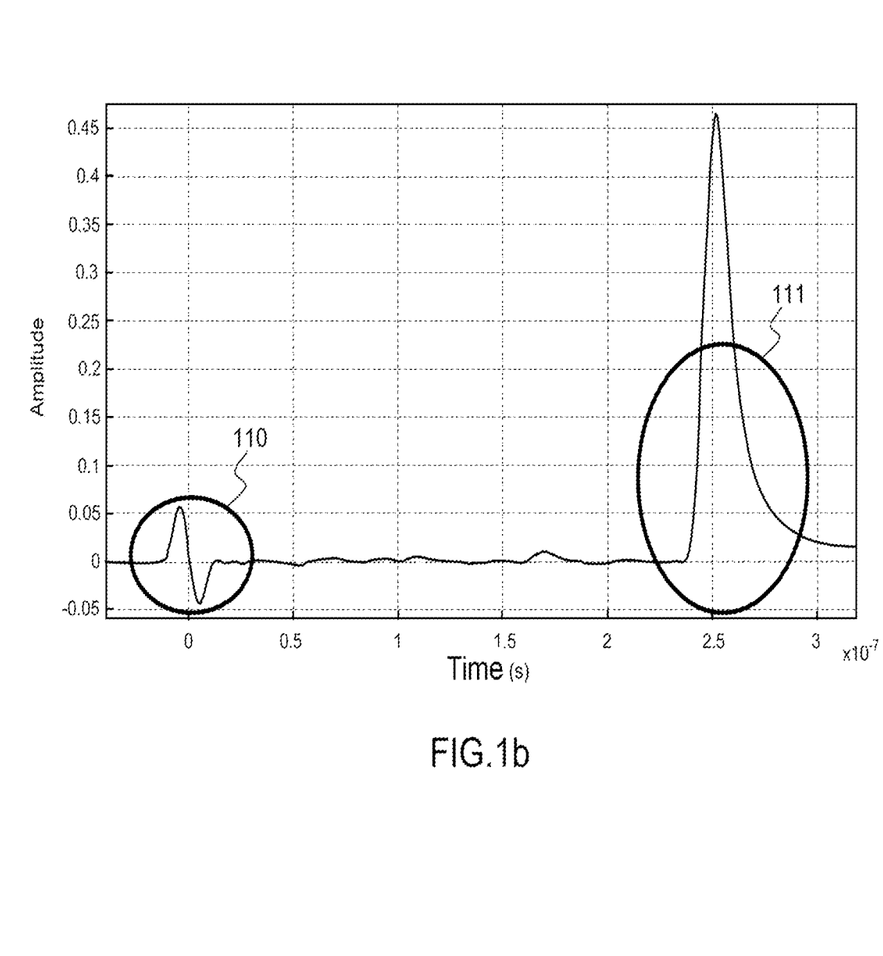

FIG. 1b shows a time-domain reflectogram obtained via a reflectometry measurement carried out by the measuring apparatus 103. In this reflectogram, there is a first peak 110 that corresponds to the reflection of the signal from the change in impedance associated with the connection 102 and a second peak 111 that corresponds to the reflection of the signal from the change in impedance due to the termination of the cable. These two reflection peaks are associated with impedance discontinuities corresponding to expected physical attributes of the system under test. Depending on the pulse width of the emitted signal, the return pulses located in the zones 110 and 111 may be more or less wide. The primary aim of a reflectometry test is to detect and locate faults in the cable to be analyzed. If there is a fault in the cable in proximity to the zones 110 and 111, the echo associated with this fault risks being masked by the echoes associated with the connector and the termination of the cable. It is for this reason that the zones 110 and 111 are referred to as blind spots.

One aim of the invention is in particular to characterize the line section corresponding to the connector 102 and to the start of the cable 101, in order to allow the contribution of a reflection of the signal from this zone to be correctly modeled. This characterization may make it possible, in a reflectometry test aiming to detect soft faults in the zone located right at the start of the cable, just after the connector 102, to compensate for the echo associated with the connector 102. In this respect, the invention allows the characterization of faults located in or near blind spots to be improved. The invention also allows changes in the characteristics of a connector 102 over time to be tracked, and thus the influence of aging or of certain physical parameters such as temperature, pressure or humidity to be identified.

Electrical cables are used to transmit electromagnetic waves, which may generally be decomposed into two main components: a voltage wave (V) and a current wave (I). If a cable that is uniform over its entire length is considered, there is a simple relationship between these two components $V(\omega)=Z_c(\omega)*I(\omega)$, where $\omega$ is angular frequency, a quantity equivalent to frequency.

$Z_c$ is the characteristic impedance of the cable. This quantity, expressed in ohms, is complex and depends on frequency. This quantity is of key importance in the exchanges of energy between the cable and systems connected to its ends. Specifically, to guarantee the transfer of a maximum of energy from one system to another, it is necessary to minimize differences between the impedance at the entrance or exit of the cable and its characteristic impedance $Z_c$. When this is not the case, what is called an impedance mismatch is observed and a wave is reflected at the interface between the two systems. This principle is valid whatever the position of the change in impedance in the cable, possibly due to faults in the cable, and is the principle on which reflectometry is founded.

Generally, an impedance mismatch between a cable and a measuring apparatus is due to a difference in the geometric shapes that are connected together, and to the nature of the materials used. The associated impedance variation is gradual and not localized and therefore complex to describe. For example, it will be understood that the connection between a network analyzer with an SMA output and a twisted-pair cable the wires of which do not remain a constant distance apart cannot be described by way of a single intermediate impedance. However, it is possible, on account of the size of the connecting elements and the working frequency, to construct a discrete model presenting a number of interfaces. With each of these interfaces is associated a voltage reflection coefficient Pi (or a current reflection coefficient if current is being worked with) that is defined in the following way:

$$\rho_i(\omega) = \frac{Z_{i+1}(\omega) - Z_i^*(\omega)}{Z_{i+1}(\omega) + Z_i(\omega)} \quad (0)$$

where $Z_1$ and $Z_2$ are the characteristic impedances of the line segments located on either side of the interface, respectively. There is a perfect duality between the characteristic impedances and the reflection coefficients. The characteristic impedances describe the waveguide segments whereas the reflection coefficients describe the joints or interfaces between these segments.

Under certain conditions it is possible to describe the behavior of a complex mismatch as the succession of a plurality of waveguide segments of varying characteristic impedances and sizes, the same going for the propagation speed and attenuation in these segments. Therefore, for a given maximum working frequency, each piece of the mismatch may be described mathematically by the doublet ($\gamma(f)$, $Z_c(f)$), where $\gamma(f)$ contains the attenuation and speed of the wave in the segment in question.

The combination of these segments forms what will be referred to as an equivalent mismatch, which should describe, as well as possible, the behavior of the actual mismatch at the frequencies in question. From the point of view of the reflectogram, the mismatch causes the incident wave to be reflected at a plurality of points, this resulting, in the time domain, in a relatively rapid succession of peaks, whereas in the frequency domain oscillations of relatively high amplitude and of variable period are seen to appear. It is moreover the study of these traces that allows the equivalent mismatch to be determined. Lastly, the mismatch depends on the physical nature of the connection between the cable and the systems connected thereto. It may therefore, for a given system and a given cable, be different depending on the mode of connection.

Figure 2:
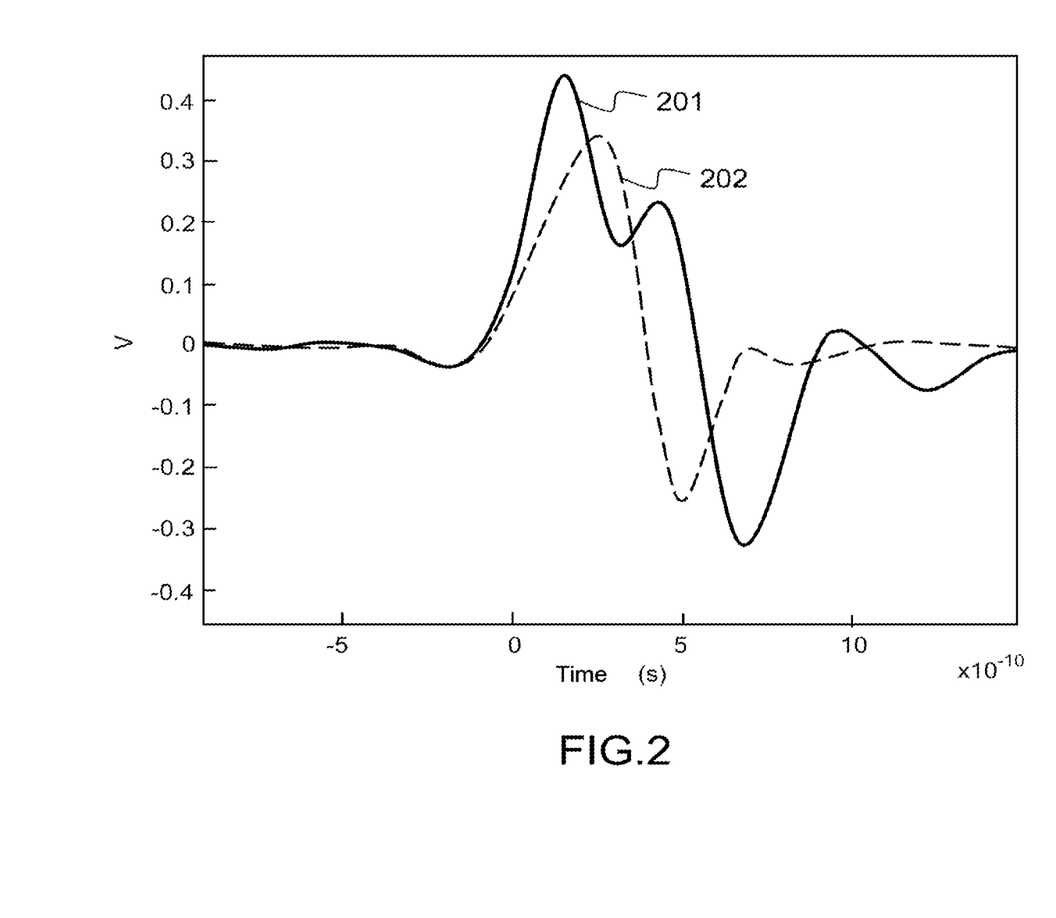
FIG. 2, a reflectogram showing the time-domain signatures of two types of connectors.

FIG. 2 illustrates this effect by way of a reflectogram that contains two curves 201, 202. The first curve 201 corresponds to a mismatch between a coaxial cable and a twisted-pair cable, which are interconnected via a chocolate block. The second curve 202 again corresponds to a connection between a coaxial cable and a twisted-pair cable, but this time connected by a solder joint. It will be noted that the nature of the connector very clearly has an influence on the mismatch, such as shown by the waveform of the echoes 201, 202.

A real mismatch has a configuration that is independent of frequency (although its response varies as a function of frequency), but certain details of its composition have an influence the visibility of which depends on whether the working frequency is high or low. It will moreover be understood, for example, that certain imperfections in a solder joint, which are about one tenth of a millimeter in size, have an influence that is only visible at very high frequencies. This is why the configuration of the equivalent mismatch varies as a function of the studied passband. This configuration will only take into account major contributions, and will therefore become increasingly complex as the highest study frequency increases.

The invention is based on modeling each equivalent mismatch as a succession of segments of individual length and characteristic impedance. Attenuation of the signal is neglected because the lengths in question are small i.e. about the average length of a connector.

In this model, the transfer function H(f) of a transmission line as a function of frequency may be expressed by the following formula:

$$H(f) = \rho_1 + \sum_{i=2}^{N} \prod_{j=1}^{i-1} (1 - \rho_j^2)\rho_i \cdot e_j^{-2*j*\pi*f*t} + X_{reflections}. \quad (1)$$

According to relationship (1), the number of segments of different characteristic impedances is equal to N+1. N is therefore the number of interfaces between two segments from which the signal may reflect. $t_i$ is the length of the $i^{th}$ segment. $\rho_i$ is the real part of the reflection coefficient of the signal from the interface between the $i^{th}$ segment in the $(i+1)^{th}$ segment. $X_{reflections}$ is a term that depends on the multiple reflections of the signal from the various interfaces.

The reflected signal s(t) measured by reflectometry is modeled by the relationship s(t)=$S_i$(t)*$R_{imp}$(t), where $S_i$ is the injected signal and $R_{imp}$ the impulse response of the cable, which is equal to the inverse frequency transform of the transfer function H(f).

Characterization of a mismatch modeled using relationship (1) amounts to finding the values of the real parts of the reflection coefficients $\rho_i$ and of the segment lengths $t_i$.

Figure 3:
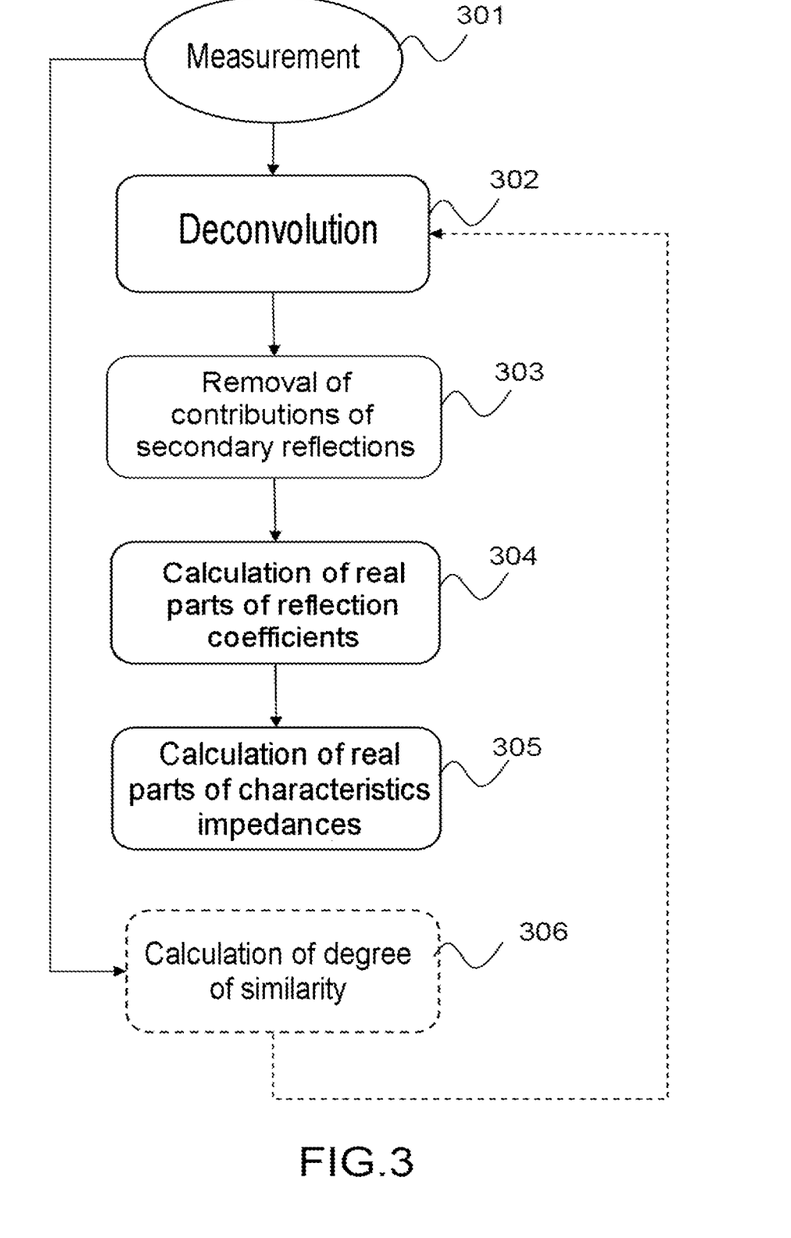
FIG. 3, a flowchart detailing the steps of the method according to invention.

The method according to the invention, which allows an equivalent mismatch to be characterized on the basis of the model given by relationship (1), will now be described in detail. FIG. 3 details the various steps of this method.

The invention is applied to a reflectometry measurement 301, preferably a time-domain measurement, performed by a measuring apparatus 103 on a cable 101.

When the invention is used to characterize a blind spot corresponding to the connection zone between the measuring apparatus 103 and the cable 101, in an initial step of the method the measurement portion 301 corresponding to the blind spot or to a mismatch that it is desired to characterize is selected. In order for the assumption of negligible attenuation to be valid, it is necessary for the selected measurement portion to respect a maximum-duration criterion. A measurement portion of duration corresponding to four times the full width at half maximum of the signal pulse injected into the cable for example allows a good compromise to be obtained between a sufficient measurement duration and a low attenuation of the signal over this duration.

In a first step of the method according to the invention, a deconvolution 302 is applied to the measurement or measurement portion 301. The aim of the deconvoluting step 302 is to remove, from the measurement 301, the contribution of the injected signal in order to obtain a sequence containing a set of amplitude peaks that correspond to the response of the propagation channel through which the signal propagated. Each peak is identified by its temporal position and its amplitude.

The deconvoluting step may, for example, be carried out using a known deconvoluting algorithm such as the CLEAN algorithm or any other equivalent algorithm.

According to one variant embodiment of the invention, the deconvoluting algorithm may be coupled to an additional linear-interpolation step in order to improve the precision with which the temporal position of the peaks is determined, this precision being limited by the sampling resolution of the measuring apparatus.

The sequence of peaks obtained at the end of the deconvoluting step 302 should provide a representation of the impedance mismatch in the measurement zone. More precisely, and as explained above in the present text, the equivalent impedance mismatch may be modeled by a succession of segments each having a constant characteristic impedance over the length of the segment, two consecutive segments being separated by an interface corresponding to a change in impedance or impedance discontinuity from which some of the injected signal may reflect.

The amplitude $A_i$ of each peak is related to the value of the real part of the reflection coefficient $\rho_i$ of the signal from the interface of temporal index i, which corresponds to the $i^{th}$ peak of the sequence, and to the values of the real parts of the reflection coefficients $\rho_j$ of the interfaces corresponding to peaks prior to the $i^{th}$ peak, by the following relationship:

$$\rho_1 = A_1 \quad (2)$$

$$\forall i \in [2, N], \rho_i = \frac{A_i}{\prod_{j=1}^{i-1}(1-(\rho_j)^2)}$$

The sequence of peaks obtained at the end of step 302 therefore gives a first approximation of the equivalent mismatch according to the aforementioned model. However, as indicated by relationship (1), all or some of the amplitude $A_i$ of each peak also consists of the contributions of secondary reflections of the signal from the interfaces. The expression "secondary reflections of the signal" is used to indicate the multiple reflection of the signal from an interface, i.e. reflections occurring after the first reflection.

A second step 303 of the method is therefore applied to the sequence of peaks issued from the deconvoluting step 302 in order to remove, from each amplitude $A_i$, the contribution of the secondary reflections of the signal.

According to one particular embodiment of the invention, the step 303 may consist of the following substeps. Firstly, it is a question of identifying the peaks located at a temporal position that potentially corresponds to an echo resulting from a multiple reflection of the signal from an interface. Next, for these identified peaks, the amplitude contribution of a multiple reflection is calculated, then this contribution is subtracted from the amplitude of said identified peak. If the amplitude that results after the subtraction is substantially zero, this peak, which corresponds entirely to a secondary reflection of the signal, is removed.

More precisely, step 303 of the method according to the invention may be carried out using the following algorithm.

In a first iteration of the method, the two first peaks of the deconvoluted sequence are selected. It is known that these two first peaks correspond to interfaces from which no multiple reflection of the signal has occurred.

The temporal spacing between these two peaks is measured, then peaks located, in the sequence, at temporal positions that are multiples of the temporal distance between the two first peaks are sought. In other words, if the temporal distance between the two selected first peaks is denoted d, peaks located at distances nd from the first peak are sought, where n is a positive integer. Specifically, it is known that secondary reflections appear only at these positions.

From relationship (2) and the amplitudes of the two selected first peaks, it is possible to calculate the real parts of the reflection coefficients $\rho_i$ and $\rho_j$ associated with the interfaces corresponding to these two first peaks. Next, the following relationship (3) allows the amplitude of the $n^{th}$ signal reflection from the interface i to be determined:

$$\forall i \in [1:N], \forall j \in [1:N], \forall n \in \mathfrak{R}, R_{n,i,j} = (-1)^n \rho_i^n * \rho_i^{n+1} * \prod_{k=1}^{i} \tau_k \quad (3)$$

where $\rho_i$ is the real part of the reflection coefficient of the interface i, $\rho_j$ is the real part of the reflection coefficient of the interface j, $R_{n,i,j}$ is the amplitude of the $n^{th}$ reflection between the interface i and j, and $\tau_k$ is the real part of the transmission coefficient of the interface k.

The value $R_{n,i,j}$ of the amplitude of the $n^{th}$ reflection is then subtracted from the amplitudes of the peaks detected at the temporal positions nd. In other words, for a given value of n for which a peak has been detected at the position nd, the value $R_{n,i,j}$ is subtracted from the amplitude of said peak.

If the result of the subtraction is substantially zero, the associated peak is removed from the sequence because it corresponds entirely to a multiple reflection of the signal. This test may be carried out by comparing the compensated amplitude to a threshold below which the amplitude is considered zero.

In one variant embodiment, the value $R_{n,i,j}$ of the amplitude of the $n^{th}$ reflection is subtracted from samples of the sequence, which samples are located at all the temporal positions nd, even those at which no peak is detected.

The parameter n, equal to the number of reflections of the signal from an interface, is an adjustable parameter of the method.

The process described above may be reiterated for all the peaks of the sequence, the two selected first peaks for which the value $R_{n,i,j}$ of the amplitude of the $n^{th}$ reflection is calculated being modified each time.

More precisely, on each iteration, the following pairs of peaks, each peak being identified by a number indicating its order of appearance, are selected: {1, 2}, {1, 3}, {2, 3}, {1, 4}, {2, 4}, {3, 4} and so on. In other words, in each new iteration, the peak successive to the two peaks selected in the preceding iteration is selected as the second peak and one of the peaks selected in one of the preceding iterations is selected as the first peak, the selected first peak being varied over all the peaks selected in the preceding iterations.

At the end of step 303 of the method according to the invention, a corrected sequence is obtained that contains only peaks the amplitude of which is characteristic of a single reflection of the signal from the corresponding interface.

The real parts of the reflection coefficients may then be calculated 304, from the amplitudes of each peak, using relationship (2). According to the envisioned model, and according to a principle that is well known in the field of reflectometry, which allows time-domain measurements on a reflectogram to be converted into distances, the temporal positions of the peaks give the actual positions of the interfaces.

From the real parts of the reflection coefficients, it is possible to deduce 305 the real parts of the characteristic impedances of each segment bounded by two successive interfaces using relationship (0).

In one variant embodiment of the invention, an additional step 306 is carried out, this step consisting in determining information characterizing the degree of similarity between an estimate of the reflected signal reconstructed from the sequence of amplitude peaks obtained at the end of step 303 and the measurement 301.

One way of reconstructing an estimate of the reflected signal is to convolute the sequence composed of the amplitude peaks, i.e. the sequence used in step 303, with the reference signal initially injected into the cable. The reconstructed estimate is then compared with the measurement 301, for example the difference between the two signals may be calculated point by point, though any other type of calculation allowing a representation of the difference between the two signals to be obtained may be used.

In another variant embodiment of the invention, it is possible to calculate the imaginary part of the characteristic impedances in addition to the real parts determined in step 305. One possible way of doing this consists in applying the teaching of the French patent application filed in the name of the Applicant under the application number FR1457980.

If both the real and imaginary parts of the characteristic impedances are calculated, the signal reflected in the cable may for example be reconstructed using a known method such as a method of the ABCD type, as described, for example, in the article "System simulation of network analysis for a lossy cable system, Q. Shi, O. Kanoun, 2012-$9^{th}$ International Multi-Conference on Systems, Signals and Devices".

Whatever the method used to reconstruct an estimate of the signal reflected in the cable from the modeling parameters obtained using the method according to the invention, it is envisioned, in another variant embodiment, to iterate all the steps of the method a plurality of times while modifying, in each iteration, one or more parameters of the deconvoluting algorithm used in step 302. For example, it is possible to modify the number of peaks generated by the deconvoluting algorithm in each iteration. At the end of all the iterations, the retained solution is that which allows the highest degree of similarity between the reconstructed measurement and the initial measurement 301 to be obtained.

By way of example, the information characterizing the degree of similarity may be taken to be the coefficient of determination $R^2$ or the likelihood ratio $V^2$.

Figure 4:
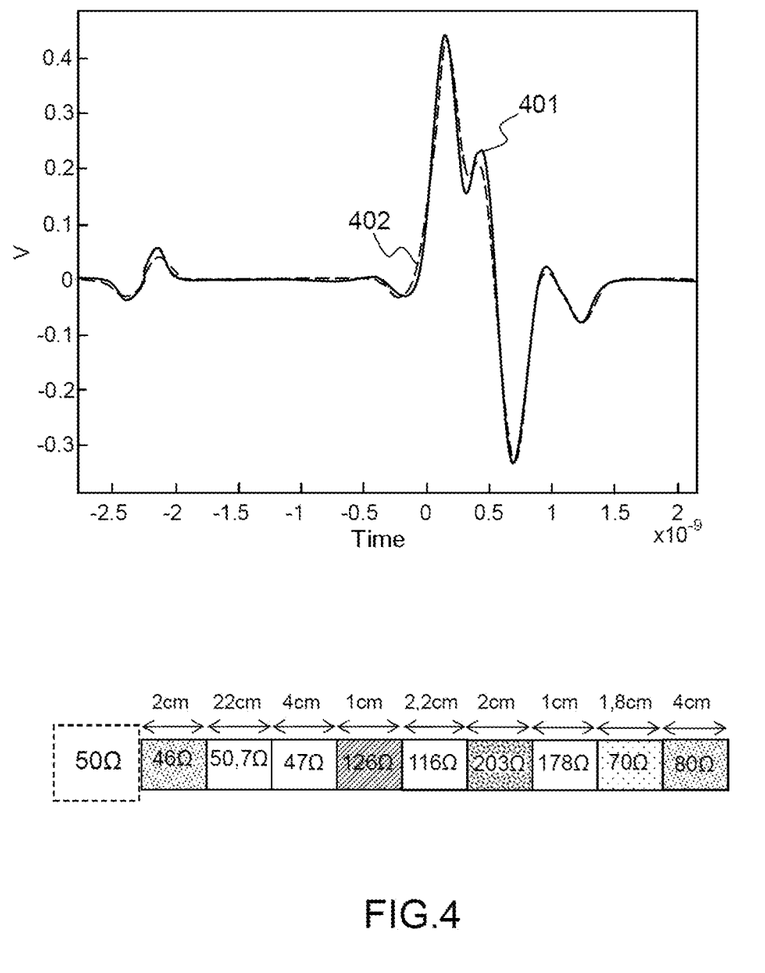
FIG. 4, a graph and a schematic illustrating an example of results obtained by applying the invention.

FIG. 4 illustrates an example of results obtained by applying the method according to the invention.

The top part of FIG. 4 shows a time-domain reflectogram 401 obtained with a twin-lead cable connected to a network analyzer having a 50 ohm output by a 50 ohm, 25 cm coaxial cable and a "chocolate block". The injected signal is a pulse of width equal to 0.22 ns. The graph in the top part of FIG. 4 also shows the reconstruction 402 of the measurement 401 obtained by the method according to the invention. The bottom part of FIG. 4 shows a schematic that illustrates the division into segments, the segments having the characteristic impedances and lengths identified in the figure. The details of the connection are indeed reproduced, with the first 28 cm corresponding to the 50 ohm coaxial cable followed by details of the chocolate block and the configuration modification due to the twin-pair cable.

According to one possible application of the method according to the invention, the latter furthermore includes a step of feeding a database with the positions and reflection coefficients and/or characteristic impedances of the calculated impedance discontinuities, each entry of the database being associated with a connector or a set of series-connected connectors intended to interconnect a measuring apparatus and a cable.

Such a database allows information on many different connectors to be assembled and allows changes in the characteristics of these connectors over time to be tracked but also changes to be tracked as a function of certain physical parameters such as temperature, humidity or any other parameter that could have an impact on the characteristic impedance of the equivalent mismatch.

The method according to the invention may be implemented using software and/or hardware elements.

The method according to the invention may be implemented directly by a processor embedded in the piece of measuring equipment 103 or in a specific device. The processor may be a generic processor, a specific processor, an application-specific integrated circuit (ASIC) or a field-programmable gate array (FPGA). The device according to the invention may use one or more dedicated electronic circuits or a general-use circuit. The technique of the invention may be implemented via a reprogrammable computing machine (a processor or a microcontroller for example) executing a program comprising a sequence of instructions, or via a dedicated computing machine (for example a set of logic gates such as an FPGA or an ASIC, or any other hardware module).

The invention may also be implemented exclusively by way of a computer program, the method then being applied to a reflectometry measurement acquired beforehand using a conventional reflectometry device. In such a case, the invention may be implemented by way of a computer program containing instructions for its execution. The computer program may be stored on a storage medium that is readable by a processor. The medium may be electronic, magnetic, optical or electromagnetic.

The reference to a computer program that, when it is executed, performs any one of the functions described above, should not be understood as being limited to an application program executed by a single host computer. On the contrary, the terms computer program and software are used here in a general sense to refer to any type of computer code (for example a piece of application software, a piece of firmware, a microcode, or any other form of computer instructions) that may be used to program one or more processors to implement aspects of the techniques described here. The computing resources or means may in particular be distributed ("cloud computing") optionally in a peer-to-peer architecture. The software code may be executed by any suitable processor (a microprocessor for example) or processor core or a set of processors, whether they be provided in a single computing device or distributed between a plurality of computing devices (for example such as possibly accessible in the environment of the device). The executable code of each program, allowing the programmable device to implement the processes according to the invention, may be stored, for example, on a hard disk or read-only memory. Generally, the one or more programs will possibly be loaded into one of the storage means of the device before being executed. The central unit may control and direct the execution of the software code sections or instructions of the one or more programs according to the invention, which instructions are stored in the hard disk or in the read-only memory or indeed in another of the aforementioned storage components.

The invention may also include a database fed by the data obtained by executing the method described in FIG. 3.

The invention claimed is:

1. A method for characterizing a segment of a transmission line, a reference signal being injected into the line and a time-domain measurement of the reflection of said reference signal in the line being carried out, said method comprising the steps of:
   applying a deconvoluting step to said time-domain measurement so as to generate a deconvoluted temporal sequence comprising a plurality of amplitude peaks each corresponding to an impedance discontinuity;
   removing, from the amplitude of at least one obtained peak, the contribution of at least one secondary reflection of the signal from an impedance discontinuity by executing at least the following steps:
      identifying the peaks located at a temporal position potentially corresponding to the at least one secondary reflection;
      calculating the amplitude contribution of the at least one secondary reflection;
      subtracting from the amplitude of the identified peak the calculated contribution; and
      if the obtained amplitude is substantially zero, removing the peak;
   deducing, from the temporal position of each peak, a position of an associated impedance discontinuity in said line segment; and
   deducing, from the amplitude of each peak, an estimate of the real part of the reflection coefficient of a wave reflected from each identified impedance discontinuity.

2. The method for characterizing a segment of a transmission line of claim 1, wherein said segment corresponds to a connector or a series of connectors connecting a piece of measuring equipment to a cable, the time-domain reflection measurement being taken in a temporal zone corresponding to the zone of presence of the connector or of the series of connectors.

3. The method for characterizing a segment of a transmission line of claim 1, wherein the deconvoluting step furthermore comprises a linear interpolation.

4. The method for characterizing a segment of a transmission line of claim 1, wherein the deconvoluting step is executed using a CLEAN algorithm.

5. The method for characterizing a segment of a transmission line of claim 1, wherein the step of removing the contribution of at least one secondary reflection comprises the substeps of:
   selecting a first peak and a second peak and measuring their temporal spacing d;
   seeking at least one third peak distant from the first peak by a temporal spacing nd that is a multiple of the temporal spacing d between the first peak and the second peak;
   determining, from the amplitudes of the first and second peaks, an estimate of the real parts of the reflection coefficients associated with the impedance discontinuities corresponding to the first and second peaks, respectively;
   determining an estimate of the amplitude of the $n^{th}$ reflection of the signal from the impedance discontinuity corresponding to the second peak, n varying over the values corresponding to the multiples nd of the temporal spacing d at which a third peak was found;
   subtracting from the amplitude of said at least one third peak, the estimate of the amplitude of the determined $n^{th}$ reflection of the signal, n corresponding to the multiple of the temporal spacing d between the first peak and the second peak at which said at least one third peak is located; and
   if the obtained amplitude is substantially zero, removing said at least one third peak.

6. The method for characterizing a segment of a transmission line of claim 5, wherein said substeps are iterated and,
   in the first iteration, the first selected peak is the first peak in the temporal order of appearance, the second selected peak being the second peak in the temporal order of appearance;
   and in the following iterations, the second selected peak is the peak successive to the two peaks selected in the preceding iteration and the first selected peak is one of the peaks selected in one of the preceding iterations.

7. The method for characterizing a segment of a transmission line of claim 1, wherein the step of removing the contribution of at least one secondary reflection comprises the following substeps:
   selecting a first peak and a second peak and measuring their temporal spacing d;
   determining, from the amplitudes of the first and second peaks, an estimate of the real parts of the reflection coefficients associated with the impedance discontinuities corresponding to the first peak and the second peak, respectively;
   determining an estimate of the amplitude of the $n^{th}$ reflection of the signal from the impedance discontinuity corresponding to the second peak, n being a nonzero positive integer; and
   subtracting the estimate of the amplitude of the $n^{th}$ reflection of the signal from the amplitude of a sample of the deconvoluted sequence, the sample being located at a distance nd that is a multiple of the temporal spacing d between the first peak and the second peak.

8. The method for characterizing a segment of a transmission line of claim 1, wherein the estimate of the real part of the reflection coefficient associated with each impedance discontinuity is determined using the following relationship:

$$\rho_1 = A_1$$

$$\rho_i = \frac{A_i}{\prod_{j=1}^{i-1}(1-(\rho_j)^2)} \text{ for } i \text{ varying from 2 to } N;$$

where $A_i$ is the amplitude of a peak indexed temporally by the integer i, $\rho_i$ is the real part of the reflection coefficient of a wave reflected from the impedance discontinuity associated with said peak, and $\rho_j$ are the real parts of the reflection coefficients of a wave reflected from the impedance discontinuities associated with the peaks preceding said peak.

9. The method for characterizing a segment of a transmission line of claim 1, furthermore comprising determining an estimate of the real part of the characteristic impedance associated with each segment of transmission line bounded by two successive impedance discontinuities, from estimates corresponding to the real parts of the reflection coefficients associated with said two impedance discontinuities.

10. The method for characterizing a segment of a transmission line of claim 9, furthermore comprising determining an estimate of the imaginary part of the characteristic impedance associated with each impedance discontinuity, from the real part of said characteristic impedance.

11. The method for characterizing a segment of a transmission line of claim 10, furthermore comprising the following steps:
reconstructing, from the determined values of the real and imaginary parts of the characteristic impedances, an estimate of the reflected signal; and
determining information characterizing the degree of similarity between the reconstructed estimate of the signal and the time-domain measurement of the reflection of the signal.

12. The method for characterizing a segment of a transmission line of claim 11, wherein the information characterizing similarity is taken to be the coefficient of determination $R^2$ or the likelihood ratio $V^2$.

13. The method for characterizing a segment of a transmission line of claim 11, wherein said method is iterated while modifying in each iteration the number of amplitude peaks extracted in the deconvoluting step, and the retained solution is that with the highest degree of similarity.

14. The method for characterizing a segment of a transmission line of claim 1, furthermore comprising the steps of:
convoluting the temporal sequence made up of the amplitude peaks compensated for the contribution of at least one secondary reflection, with the reference signal; and
determining information characterizing the degree of similarity between the convoluted sequence and the time-domain measurement of the reflection of the signal.

15. The method for characterizing a segment of a transmission line of claim 1, furthermore comprising feeding a database with the positions and reflection coefficients and/or characteristic impedances of the calculated impedance discontinuities, each entry of the database being associated with a connector or a set of series-connected connectors intended to interconnect a measuring apparatus and a cable.

16. A database comprising a plurality of pairs of values of positions and reflection coefficients and/or characteristic impedances of impedance discontinuities, said plurality of pairs being determined by executing a method for characterizing a segment of a transmission line, a reference signal being injected into the line and a time-domain measurement of the reflection of said reference signal in the line being carried out, said method comprising the steps of:
applying a deconvoluting step to said time-domain measurement so as to generate a deconvoluted temporal sequence comprising a plurality of amplitude peaks each corresponding to an impedance discontinuity;
removing, from the amplitude of at least one obtained peak, the contribution of at least one secondary reflection of the signal from an impedance discontinuity by executing at least the following steps:
identifying the peaks located at a temporal position potentially corresponding to the at least one secondary reflection;
calculating the amplitude contribution of the at least one secondary reflection;
subtracting from the amplitude of the identified peak the calculated contribution; and
if the obtained amplitude is substantially zero, removing the peak;
deducing, from the temporal position of each peak, a position of an associated impedance discontinuity in said line segment; and
deducing, from the amplitude of each peak, an estimate of the real part of the reflection coefficient of a wave reflected from each identified impedance discontinuity.

17. A tangible non-transitory processor-readable recording medium on which is stored a program comprising instructions for executing a method for characterizing a segment of a transmission line, a reference signal being injected into the line and a time-domain measurement of the reflection of said reference signal in the line being carried out, said method comprising the steps of:
applying a deconvoluting step to said time-domain measurement so as to generate a deconvoluted temporal sequence comprising a plurality of amplitude peaks each corresponding to an impedance discontinuity;
removing, from the amplitude of at least one obtained peak, the contribution of at least one secondary reflection of the signal from an impedance discontinuity by executing at least the following steps:
identifying the peaks located at a temporal position potentially corresponding to the at least one secondary reflection;
calculating the amplitude contribution of the at least one secondary reflection;
subtracting from the amplitude of the identified peak the calculated contribution; and
if the obtained amplitude is substantially zero, removing the peak;
deducing, from the temporal position of each peak, a position of an associated impedance discontinuity in said line segment; and
deducing, from the amplitude of each peak, an estimate of the real part of the reflection coefficient of a wave reflected from each identified impedance discontinuity.

* * * * *